United States Patent
Tse et al.

(10) Patent No.: US 9,170,986 B2
(45) Date of Patent: Oct. 27, 2015

(54) POWER QUALITY METER AND METHOD OF WAVEFORM ANAYLSIS AND COMPRESSION

(75) Inventors: Chung-Fai Tse, Hong Kong (CN); Wing-Hong Lau, Hong Kong (CN)

(73) Assignee: CITY UNIVERSITY OF HONG KONG, Kowloon Tong, Kowloon (HK)

(*) Notice: Subject to any disclaimer, the term of this patent is extended or adjusted under 35 U.S.C. 154(b) by 590 days.

(21) Appl. No.: 12/940,149

(22) Filed: Nov. 5, 2010

(65) Prior Publication Data

US 2011/0112779 A1 May 12, 2011

(30) Foreign Application Priority Data

Nov. 6, 2009 (HK) .................................. 09110377.3

(51) Int. Cl.
*G01R 19/25* (2006.01)
*G06F 17/14* (2006.01)
*H03M 7/30* (2006.01)
*H04B 3/54* (2006.01)

(52) U.S. Cl.
CPC .......... *G06F 17/148* (2013.01); *G01R 19/2513* (2013.01); *H03M 7/30* (2013.01); *H04B 3/546* (2013.01); *H04B 2203/5433* (2013.01); *H04B 2203/5458* (2013.01); *H04B 2203/5495* (2013.01)

(58) Field of Classification Search
CPC .................................................. G01R 19/2513
USPC .............................. 702/60, 66, 70, 74, 75, 80
See application file for complete search history.

(56) References Cited

U.S. PATENT DOCUMENTS

| | | | |
|---|---|---|---|
| 7,071,852 B1* | 7/2006 | Wegener | 341/61 |
| 7,415,370 B2* | 8/2008 | Nisenblat et al. | 702/66 |
| 2004/0024548 A1* | 2/2004 | Genther et al. | 702/75 |
| 2010/0195770 A1* | 8/2010 | Ricci et al. | 375/322 |

OTHER PUBLICATIONS

HKSAR Government, Study on the Potential Applications of Renewable Energy in Hong Kong, Stage I Study Report, (Dec. 2002).
Microgrids—"Large Scale Integration of Micro-Generation to Low Voltage Grids," EU Contract ENK5-CT-2002-00610, http://microgrids.power.ece.ntua.gr, Dec. 2003.
Lee, RPK et al.; "A Web-Based Multi-Channel Power Quality Monitoring System for a large Network," Proceedings of 5th Intl. Conf. on Power System Mgmt. and Control, IEE UK, London, pp. 112-117, (Apr. 17-19, 2002).

(Continued)

*Primary Examiner* — Sujoy Kundu
*Assistant Examiner* — Ricky Ngon
(74) *Attorney, Agent, or Firm* — Leydig, Voit & Mayer, Ltd.

(57) ABSTRACT

A method for waveform analysis and compression includes determining harmonic components of a waveform, subtracting the harmonic components from the waveform, leaving a residual waveform, and compressing the residual waveform. Information about the harmonic components and the compressed residual transform can be transmitted across a network for analysis or reconstruction of the waveform in another device. The method is used in a low cost power quality meter, which can form part of a smart metering scheme.

23 Claims, 10 Drawing Sheets

(56) References Cited

OTHER PUBLICATIONS

Tsang, K.F. et al.; "ZigBee and Power Line Energy Management Solution for World Class City," Proceedings of the 7$^{th}$ Annual Power Symposium, The Institution of Eng. and Tech. Hong Kong, pp. 35-39 (Jun. 20, 2008).

Cavdar, H.; "A Solution to Remote Detection of Illegal Electricity Usage via Power Line Communications," *IEEE Trans. Power Delivery*, vol. 19, No. 4, (Oct. 2004).

Frigo, M. et al.; "FFTW an Adaptive Software Architecture for the FFT," Proceedings of the Intl. Conf. on Acoustics, Speech, and Signal Processing, vol. 3, pp. 1381-1384, (1998).

British Standard-EN61000-4-7:2002; "Electromagnetic Compatibility—(EMC) Part 4-7: Testing and measurement techniques—General Guide on harmonics and interharmonics measurements and instrumentation, for power supply systems and equipment connected thereto," (May 2005).

\* cited by examiner

POWER QUALITY METER AND METHOD OF WAVEFORM ANAYLSIS AND COMPRESSION

CROSS-REFERENCE TO RELATED APPLICATION

This application claims benefit under 35 U.S.C. §119(a) of Hong Kong Short-term Patent Application having Serial No. 09110377.3 filed Nov. 6, 2009, which is hereby incorporated by reference herein in its entirety.

FIELD OF INVENTION

The present invention relates to power quality meters. The invention also relates to power quality analysis and in particular to a method of waveform analysis and compression.

BACKGROUND OF INVENTION

Smart metering infrastructures consisting of basic energy meters and a dedicated communication network are popular nowadays which provide a reliable, fast and cost-effective solution to demand side management. Smart meters normally measure kWhr for energy monitoring and billing. Recently, power quality (PQ) is becoming a raising concern to building management due to the proliferation of power electronic devices in buildings. As present smart meters do not measure power quality, PQ meters have to be used to measure electrical power, voltages, currents, power factor and THD. High-end PQ meters also provide information on individual harmonics and waveform capturing for events reporting. They are mostly expensive. Networked PQ monitoring systems are available and the high installation cost of which limits its applications to major circuits and equipment in buildings.

SUMMARY OF INVENTION

In the light of the foregoing background, it is an object of the present invention to mitigate or obviate to some degree one or more problems associated with known power quality meters.

The above object is met by the combination of features of the main claim; the sub-claims disclose further advantageous embodiments of the invention.

One skilled in the art will derive from the following description other objects of the invention. Therefore, the foregoing statements of object are not exhaustive and serve merely to illustrate some of the many objects of the present invention.

This is not intended however to limit the scope of the invention and further aspects of the invention will become apparent from the following description which is given by way of example only.

There are many advantages to the present invention, as the novel power quality analysis method operates on a commercial grade micro-controller unit and is able to measure basic power information and harmonic information, provide PQ indicators for transients, voltage sags, voltage swells and notches, and conduct waveform feature extraction and compression for transmission over narrow-band low bit-rate communication network such as ZigBee. The algorithm used in the power quality analysis method utilizes the stationary property of fundamental and harmonic component in the power system to separate the disturbance from the signal. The low complexity requirement of this algorithm makes it suitable for implementation on embedded system like smart meters.

The waveform disturbance extraction method in the present invention has advantages over the wavelet decomposition. It utilizes the stationary property of fundamental and harmonic component in the power system to separate the disturbance from the signal. In comparison, the conventional wavelet decomposition decomposes the signal only by frequency bands, and thus it is not adapted to separate the wildly spreading impulse transient. The method in the present invention provides a solution for analyzing the disturbance event by isolating the disturbance components in both voltage and current waveforms. This process performs preliminary waveform feature extraction and data compression functions. Harmonics information is available in the compressed signal for local display. In one embodiment, PQ indicators are derived from the wavelet coefficients for quick identification of PQ events. Unlike traditional PQ meters that only integer harmonics are identified, it preserves all waveform information enabling detailed analysis.

Another advantage of the present invention is that in addition to conducting power calculations and PQ disturbance indications at the smart meter, highly compressed voltage and current waveform information can be transmitted to the remote central management system of a smart metering infrastructure for storage and further analysis. In one implementation the resulting compressed waveform data requires only 1.5 times the data bits required by a conventional PQ meter in representing power information of stationary voltage and current waveforms.

In another aspect of the present invention, the smart meter and methods described above in the embodiments of the present invention can be implemented as part of a Smart Metering Infrastructure. Its purposes and applications are (i) to provide a low-cost meter solution for power and power quality monitoring;

(ii) to record power consumptions for market-driven electricity billing;

(iii) to record power disturbance information so that remedial actions would be taken;

(iv) to provide a feasible monitoring and analysis solution to future building micro-grid systems and in-building electric vehicle charging networks;

(v) to perform power information compression for data transmission over narrow-band, low bit-rate wireless communication network such as ZigBee;

(vi) to enable detailed and comprehensive power quality analysis at central data management system of a smart metering infrastructure by recording voltage and current waveforms with an error of 1%;

(vii) to provide power consumption display on the smart meter to alert consumers of the need to save energy;

(viii) to provide future smart meter level on-off control to switch off equipment when reaching a pre-determined consumption.

Compared to conventional smart metering infrastructure which only measures total power consumption but detailed information on the power variation is not provided, the smart metering infrastructure in the present invention provides:

(i) low-cost equipment—outperform the conventional meter;

(ii) instantaneous Analysis—to provide information about the time-variant electrical power signal so that analysis on the amplitude/phase/frequencies can be conducted instantaneously;

(iii) prompt and fast analysis—real-time analysis is carried out by applying sophisticated and efficient digital signal processing techniques;

(iv) remote data retrieval—the analysis is carried out in digital format so that remote control station can retrieve the data when a digital link is connected;

(v) highly compressed power data—an efficient compression algorithm is used so that data can be transmitted over narrow-band low bit-rate network such as ZigBee, with an achievable loss of 1%;

(vi) data storage—the analysis is in digital format so that storage or back up is simple and cheap; and (vii) easy installation—The whole system is all about digital equipment which can be compact in size for easy and installation.

BRIEF DESCRIPTION OF FIGURES

The foregoing and further features of the present invention will be apparent from the following description of preferred embodiments which are provided by way of example only in connection with the accompanying figures, of which.

DETAILED DESCRIPTION OF THE PREFERRED EMBODIMENTS

Figure 1:
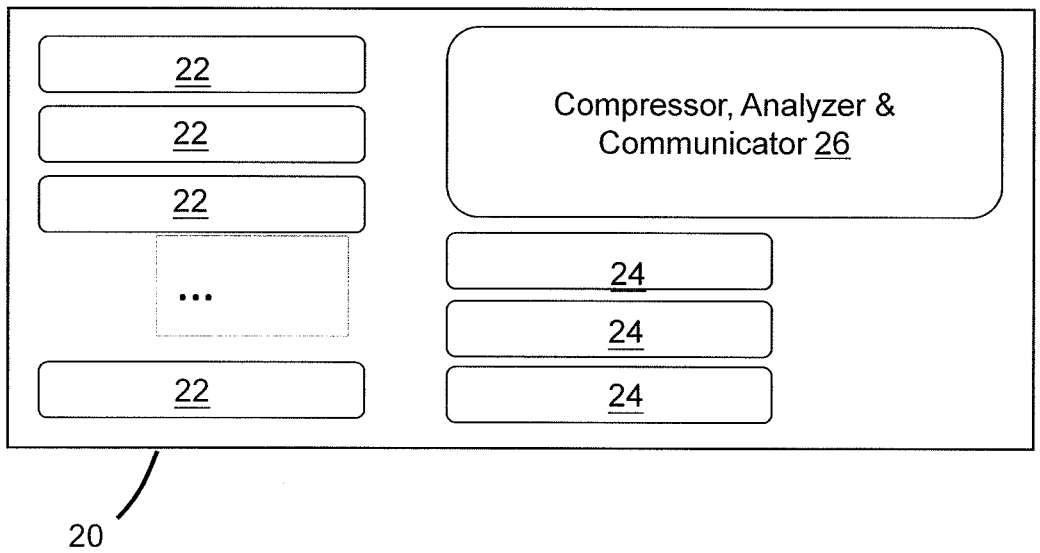
FIG. 1 is a schematic diagram of a smart metering block according to one embodiment of the invention.

Before any embodiments of the invention are explained in detail, it is to be understood that the invention is not limited in its application to the details or arrangements set forth in the following description or illustrated in the drawings. The invention is capable of other embodiments and of being practiced or of being carried out in various ways. Also, it is to be understood that the phraseology and terminology used is for the purpose of description only and should not be regarded as limiting.

The power quality metering device or simple power quality meter, in one embodiment of the present invention, performs the following functions: recording voltage/current waveforms of a signal, performing waveform data compression, and transmitting compressed data through ZigBee protocol to a central management system such that all data received from the power quality meter is processed centrally for power calculation and power quality analysis. Current and voltage waveform of the signal are recorded because they contain all the necessary information for power calculation and power quality analysis. The method/algorithm used for waveform analysis and compression methods will be discussed later.

Turning now to FIG. 1, which shows a schematic diagram of the power quality meter in one embodiment of the present invention. Each metering device 20 consists of twelve current meters 22, three voltage meters 24 and a Compressor, Analyzer & Communicator 26. This configuration with the specific number of voltage meters/current meters is to fully utilize the communication capacity of the ZigBee communication network. In the power quality meter, the sensors collect digitized data sample for the Compressor, Analyzer & Communicator 26. Thereafter, the Compressor, Analyzer & Communicator 26 analyzes the raw data captured, compresses the captured waveforms, analyzes the captured waveforms to indicate disturbance Power Quality event e.g. Voltage Sag, Swell, etc. The Compressor, Analyzer & Communicator 26 also transmits or stores compressed data and analyzed result. The details of these operations will be given in the description below.

Figure 2:
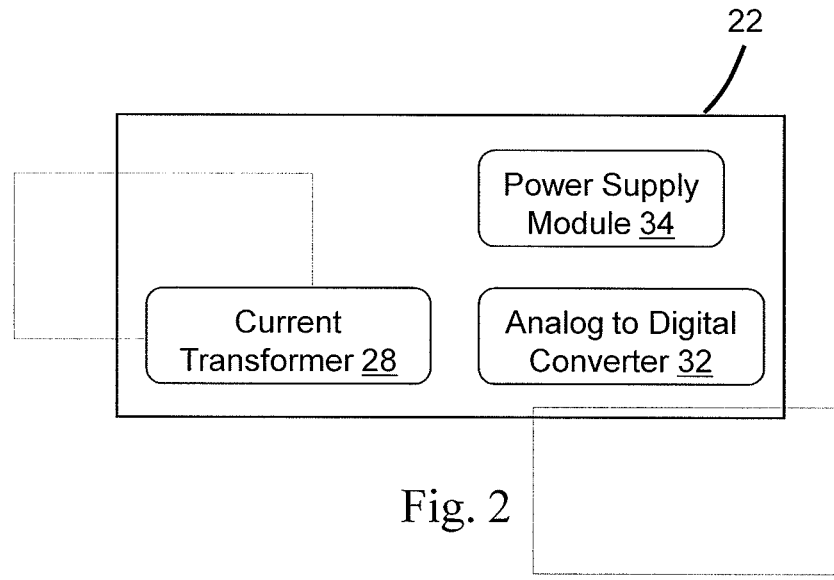
FIG. 2 is a schematic diagram of the meter according to one embodiment of the invention.

FIG. 2 shows the detailed schematic of a current meter 22 in one embodiment. The voltage measurement meter 24 has a similar structure as that in FIG. 2. The meter consists of a power supply module 34, a current transformer 28, an A/D converter 32 and a MCU 30 for executing waveform compression algorithm. The power supply module 34 is for supplying electric power for other components in the meter such as the current transformer 28 and the A/D converter 32. The current transformer 28 is preferably a Hall Effect current transformer to act as a sensor to detect and capture the waveform of the electricity. The MCU 30 is a common type of processor that has computational power to execute software algorithms. The A/D converter 32 has the function of converting analog signals (e.g. the current and/or voltage) to digital signals for subsequent compression/data extraction described herein.

Figure 3:
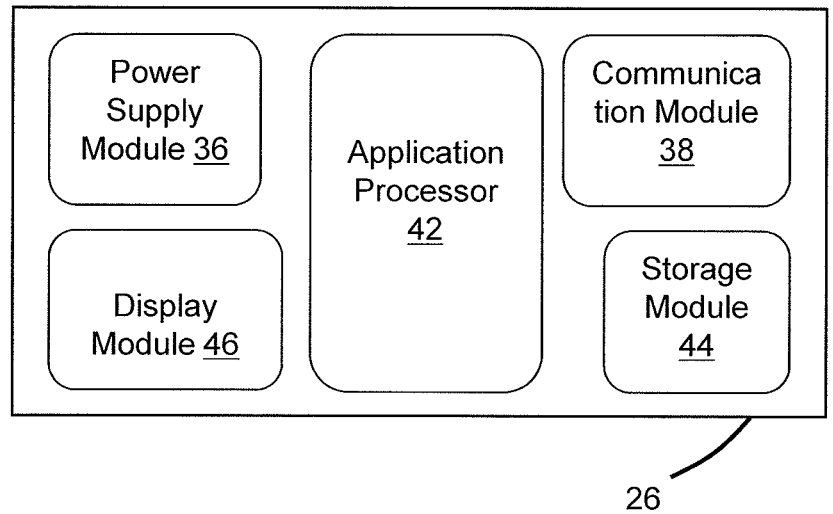
FIG. 3 is a schematic diagram of the Compressor, Analyzer & Communicator module according to one embodiment of the invention.

FIG. 3 shows the detailed schematic of the compressor, analyzer & communicator 26 in one embodiment. The Compressor, Analyzer & Communicator module consists of a power module 36, a data storage module 44, an application processor 42, a network module 40 and a communication module 38. The power module 36 has a similar function as the power supply module 34 in FIG. 2 which is to is used to power up the various modules. The data storage module 44 preferably includes a Random Access Memory (RAM) or a FLASH memory to temporarily or permanently store collected data and required software programs to carry out the operation of the power quality meter. In one embodiment the communication module 38 is a ZigBee module. In another embodiment, the communication module 38 may be a power line carrier (PLC) module as necessary. The application processor 42 is to perform waveform compression and to coordinate the operations of various components mentioned above in the Compressor, Analyzer & Communicator 26. Optionally the Compressor, Analyzer & Communicator 26 may also includes a display module 46 to display the value of the measured voltage/current or any other relevant information. In one embodiment, the application processor 42 retrieves the digitized waveform from the sensors. It executes a waveform compression algorithm and a disturbance analyze algorithm. Thereafter, it transmits the results (compressed waveform and analyzed result) through the communication module 38 (e.g. Zigbee, PLC), or store the results in the data storage module 44, or display the results in the display module 46.

In order to preserve all PQ information contained in the power waveform for detailed analysis and at the same time to reduce storage and data transmission burden, the current invention provides a method for power quality meters to capture voltage and current waveforms and to perform waveform feature extraction and compression, which will be described as follow. According to the standard EN61000-4-7 for harmonic measurements, the accuracy requirement is divided into two classes, Class I and II. Class I instrument is suggested for precise measurements and Class II instrument is suggested for general surveys. Both classes can be are supported in our design.

In accordance with the requirements of EN 61000-4-7 for harmonics measurements, the time window length used for voltage and current waveforms capturing is 0.2 second, and power and harmonics estimations are conducted for each 0.2-second waveform. As the compressed waveform data mentioned that will be described later contains all information of fundamental components and individual harmonics, power estimations (kVA, kW, kWhr, kVAR, Root Mean Square (RMS) voltage, RMS current, and power factor), and power harmonics information on individual harmonics (frequency, rms value and instantaneous phase) & THD would be produced readily. Power calculations and harmonics estimations will follow the definitions of EN61000-4-7 and IEEE 1459:2000.

Figure 7:
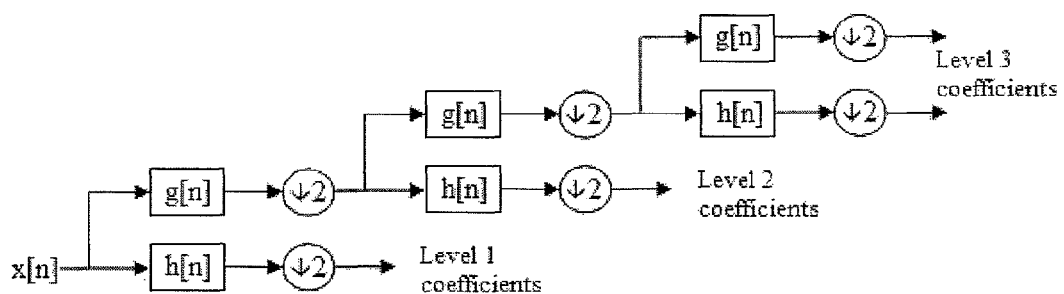
FIG. 7 is a schematic illustration of a Discrete Wavelet Transform.
Figure 8:
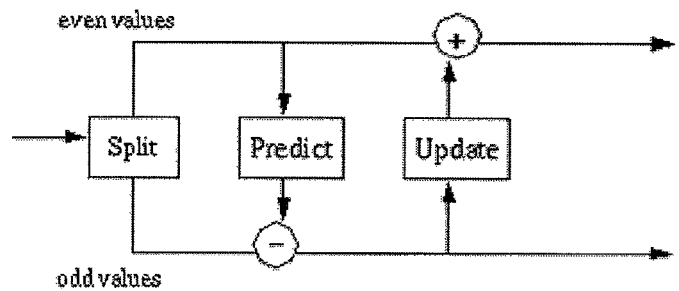
FIG. 8 is a schematic illustration of a lifting scheme according to one embodiment of the invention.
Figure 9:
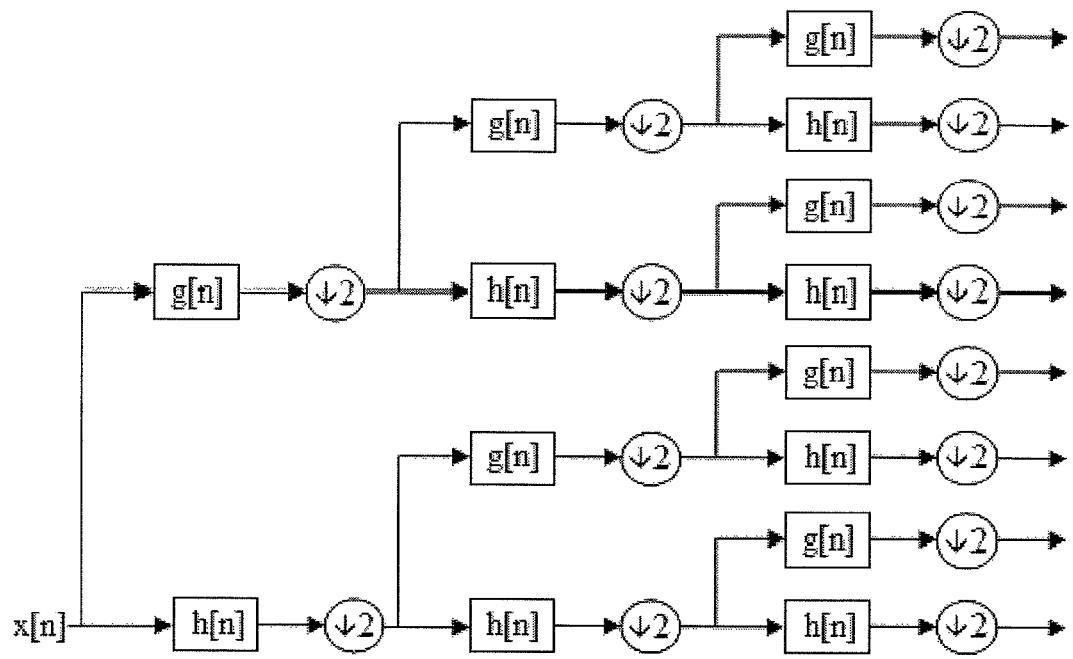
FIG. 9 is a schematic illustration of a Discrete Wavelet Package Transform.

Discrete Wavelet Transform (DWT) is adopted in a variety of application, especially in image compression. It helps to analyze signals in the time-frequency domain by composing the signals into different level of frequency bands. A typical DWPT process is shown in FIG. 7, where g[n], a low-pass FIR filter and h[n], a high-pass FIR filter, also down-sampling is preformed after iterations. The Discrete Wavelet Package Transform (DWPT) is the extension of Discrete Wavelet Transform (DWT). It is similar to DWT, but it also decomposes both the high and low pass output at each level as shown in FIG. 9. The filters g[n] and h[n] can be replaced by lifting steps shown in FIG. 8. A DWPT is used in preferred embodiments of the present invention since it is suitable for distortion sensitive application. In addition, it also supports integer to integer mapping by using lifting scheme so that prefect reconstruction is achievable particularly for intolerable signal distortion.

In this process, no matter the inputs are integer or floating-point, it turns out that the output coefficients must be floating point numbers, due to the floating point coefficients of the Finite Impulse Response (FIR) Filter. Floating point numbers are not suitable for data compression as floating-point number requires long data length or otherwise it may cause precision problems. Thus, DWT is done by lifting scheme. The nature of the lifting scheme makes Integer Discrete Wavelet Transform (IDWT) simple and easy to implement, since adaptive filtering techniques can be added-on the transform process easily and prefect reconstruction is simply reversing all the procedures during transform. Furthermore, all the existing wavelet filters can be transformed into lifting steps as shown in FIG. 8.

Figure 4:
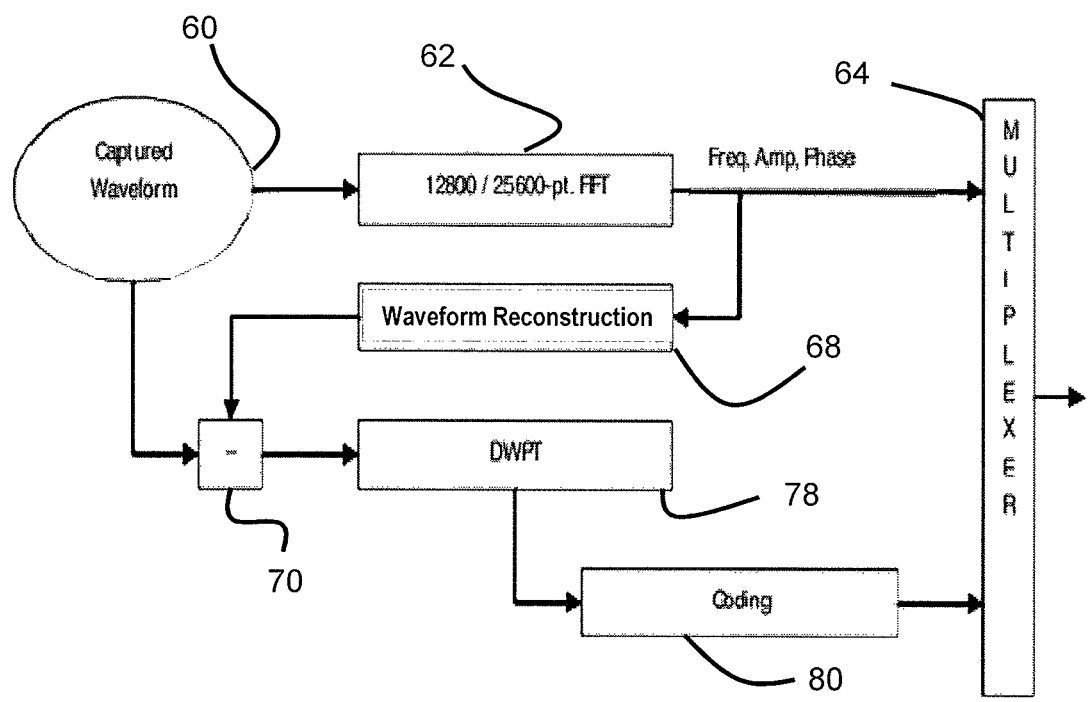
FIG. 4 is a schematic block diagram illustrating a waveform feature extraction and compression method according to one embodiment of the invention.
Figure 5:
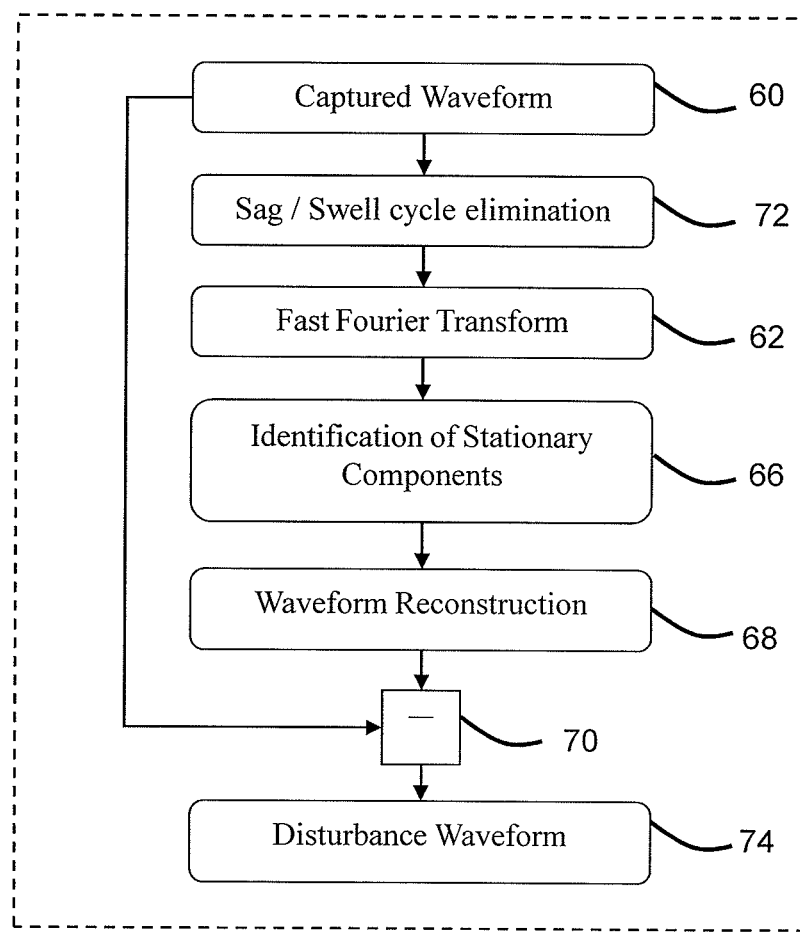
FIG. 5 is a flow chart showing a more detailed work flow of the disturbance waveform extraction process in FIG. 4.

The flowchart of waveform feature extraction and compression process according to one embodiment of the present invention is shown in FIG. 4 and FIG. 5. It makes use of a hybrid Discrete Fourier Transform (DFT)—Discrete Wavelet Packet Transform (DWPT) technique to extract waveform features from the power waveform, which is the product of the voltage waveform and current waveform. The hybrid DFT-DWPT method can be implemented on a commercial microcontroller unit. The rationale of adopting a hybrid approach is that power quality issues found in building electrical networks are mainly harmonics, voltage sag, voltage swell and transients. Variations in current amplitudes due to load variations are not PQ issues but would create difficulties in harmonics estimation. In a preferred embodiment of the invention FFTW is used to extract harmonic components from the waveform.

In FIG. 4 and FIG. 5, the power waveform captured by the power quality meter as shown in FIG. 1 serves as the input 60 to the waveform analysis and compression algorithm. In Step 62 a FFT is applied on the waveform and in one embodiment the FFT is a 12800/25600 points FFT. Optionally, to discard the abnormal cycles in the voltage waveform captured, a Hamming or Blackman window in Step 72 in FIG. 5 is applied first on the input waveform before applying the FFT. The cycle with voltage sag or swell will be discarded, and only the normal cycles will be feed into the FFT to detect the sinusoidal components in the captured waveform. This will ensure that the stationary harmonic components of the waveform would be represented by their respective frequencies, amplitudes and phases without being affected by spectrum leakages. In another example, if ten 50 Hz voltage cycles are captured in each analysis, and if the voltage cycles captured are normal, all the cycles are preserved for the next stage. In Step 66, the stationary component in the waveform after FFT process is identified based on frequency characteristics of stationary signals as the stationary components are concentrating like an impulse in the spectrum while the non-stationary signals spread over the spectrum, which is well known in the art. The output of the step 62 is the frequency, amplitude and phase information of the stationary component of the waveform and it will later be inputted into the multiplexer 64. In one embodiment the multiplexer is software implemented by the application processor in the Compressor, Analyzer & Communicator module 26.

On the other hand, the amplitude, frequency and phase information of the stationary component of the waveform will be used to reconstruct a waveform in the reconstruction step 68. Next, the disturbance waveform 74 or say harmonic components are obtained by subtracting the reconstructed waveform from the original waveform at the input 60. In Step 78 DWPT is used to represent the residue signal into wavelet coefficients which is suitable for transmission by the communication device mentioned above. DWPT is able to represent time and frequency information of a waveform. Applying DWPT to the residue signal rather than to the non-stationary waveform directly would reduce the magnitude of the wavelet coefficients and that DWPT alone is unable to identify exact frequencies of the harmonic components.

After the wavelet coefficients are obtained, a suitable coding scheme is applied to the wavelet coefficients in Step 80 to perform data compression in order to further increase the compression ratio. In a preferred embodiment, the coding scheme applied is Huffman coding which is a well-known lossless data compression method. In the Step 80 Wavelet coefficients that are not significant will be discarded to reduce data size. The harmonic information and wavelet coefficients as a compressed waveform data will then be multiplexed with the amplitude, frequency and phase information in the multiplexer 64. The multiplexed data is then ready for transmission over the communication network to the central management system and/or storage subsequently.

The waveform compression ratio after Step 80 varies according to waveform contents. For example, for stationary harmonic waveforms containing common harmonics, the compression ratio is approximately 1:27 and is lossless. For harmonic waveforms containing instantaneous amplitude changes or an oscillatory transient, the compression ratio is approximately 1:4.5, with an overall reconstruction loss of 1%. Higher compression ratio can be achieved by relaxing the requirement on reconstruction loss.

Figure 6:
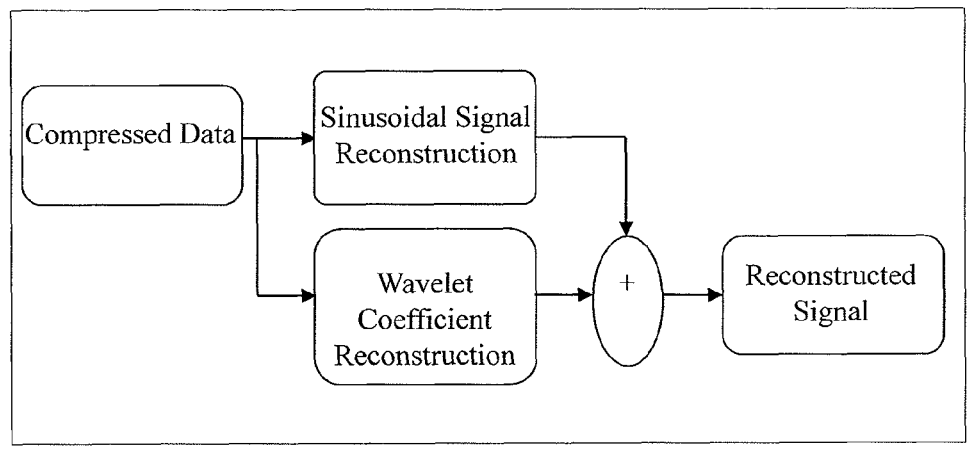
FIG. 6 is a schematic block diagram illustrating a waveform reconstruction method according to one embodiment of the invention.

The compressed waveform data transmitted from the power quality meter over a communication network and received by a remote central management system would be reconstructed easily and detailed power quality analysis and power calculations would be conducted. In one embodiment, the waveform reconstruction process corresponding to the waveform compression method described above is shown in FIG. 6. It is basically a reverse process of the waveform analysis and compression process as shown in FIG. 4. The amplitude, frequency and phase information of the stationary component are used for the sinusoidal signal reconstruction and the wavelet coefficients are used for reconstructing harmonic components or non-stationary components. The stationary component and the harmonic components are then summed to form a reconstructed signal which is almost identical to the original waveform.

In another aspect of the present invention, the invention also provides a method for PQ disturbance classification. In one embodiment of the present invention, PQ indicators are derived from wavelet coefficients for voltage sag and swell, notches, abrupt current changes and transients (voltage and current). According to Parseval's theorem, the energy of a distorted signal can be partitioned into various decomposition levels of the DWPT. Standard deviations and root-mean-square values computed at different decomposition levels can be used to classify various disturbances.

Figure 10:
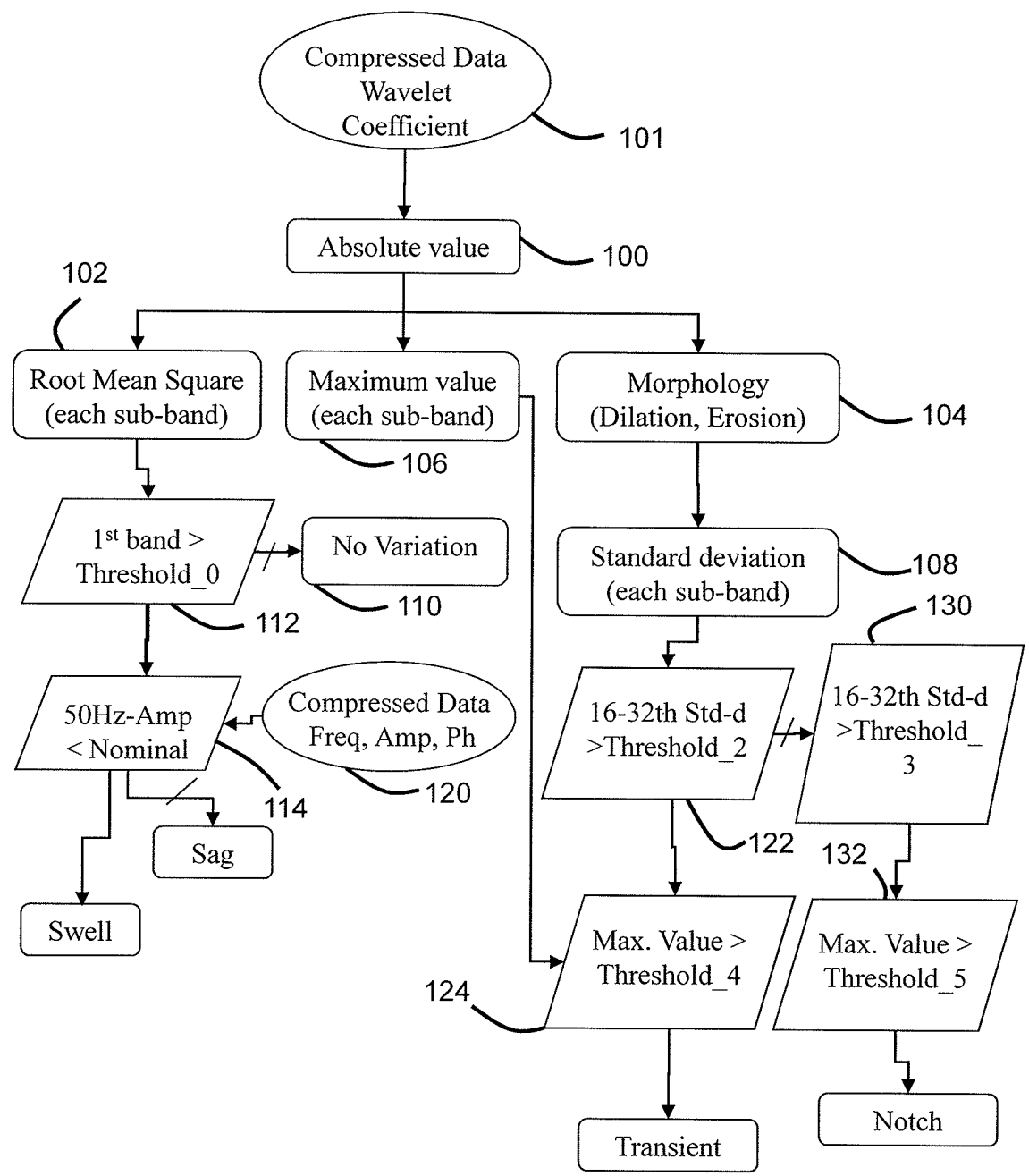
FIG. 10 is the illustration of a flow chart for estimating power quality indicators according to one embodiment of the present invention.

FIG. 10 shows the flowchart on estimating the PQ indicators from the wavelet coefficients according to one embodiment of the present invention. After the compression process, information of the sinusoidal parameters (frequency, amplitude and phase) and wavelet coefficients of each sub-band are available for classifying the disturbance. In normal circumstance, the wavelet coefficient represents the variation and transient of the captured electrical signal, since all harmonic components are already removed from the signal.

In a preferred embodiment, this method is preferably executed immediately after the waveform feature extraction and compression process. It is designed to lower the burden of the central management system of the SMI by pre-analyzing the captured electrical signal and classify them into different types of disturbance. In another embodiment, this method is executed after the central management system received the waveform data before the reconstruction. The method makes use of a set of rules, statistical analyses and mathematical morphology (e.g. dilation and erosion) to classify the disturbance. The statistical analyses include the maximum value, mean and the standard deviation. At the present stage, the method is capable to classify the disturbance into 'Normal', 'Voltage Swell', 'Voltage Sag', 'Current Variation', 'Transient (voltage and current)', 'Notches' and 'Unclassified'.

Referring to FIG. 10, the compressed wavelet coefficients and the sinusoidal components are provided as the inputs to the method in Step 101 and 120 respectively. The method firstly converts the wavelet coefficients into their absolute values in Step 100 and then search for the maximum in Step 106 and mean in Step 102 for each sub-band. Next, in Step 104 mathematical morphology such as dilation and erosion processes are applied to the absolute wavelet coefficients to smooth the series of coefficients, and the standard deviation for each sub-band is then calculated in Step 108. When the sinusoidal parameter, maximum, mean and standard deviation of modified wavelet coefficient are available, a set of logical rules can be applied to classify the disturbance. In one implementation the rules for disturbance classification are listed below.

Voltage Sag:
1. In Step 112, Mean value of 1st band is greater than threshold_0 and
2. In Step 114, amplitude of the 60/50 Hz fundamental component is below the nominal voltage (e.g. 110V/220V) and Voltage Swell:
1. In Step 112, Mean value of 1st band is greater than threshold_0 and
2. In Step 114, amplitude of the 60/50 Hz fundamental component is above the nominal voltage (e.g. 110V/220V) and Current Variation:
1. In Step 112, mean value of the 1st band is greater than threshold_0

Transient:
1. In Step 122, X out of 12 bands or more in 21st-32nd band's standard deviation divided by Mean value is greater than threshold_2
2. In Step 124, X out of 12 bands or more in 21st-32nd band's maximum value is greater than threshold_4 and Notches:
1. In Step 122 and 130, Y out of 12 bands or more in 21st-32nd band's standard deviation divided by mean value is smaller than threshold_2 but greater than threshold_3
2. In Step 132, Y out of 12 bands or more in 21st-32nd band's maximum value is greater than threshold_5 and Unclassified:
1. Do not satisfy any class of disturbance requirements listed above and
2. Do satisfy any one or more requirements below:
   a) 1 out of 32 bands in 1st-32nd band's mean value is greater than threshold_6
   b) 1 out of 32 bands in 1st-32nd band's standard deviation divided by mean value is greater than threshold_7

Normal:
1. Do not satisfy any class of disturbance requirements listed above or
2. Wavelet coefficients are zero According to the embodiments of the present invention, in the list above the values of the various thresholds and all threshold settings are adjustable which can be defined by users. The disturbance classification results can be displayed at the power quality meter in its display module. The same can be transmitted to the central management system of the SMI together with the harmonic information and the compressed wavelet coefficients for data storage and other operations such as power quality audit.

Figure 11:
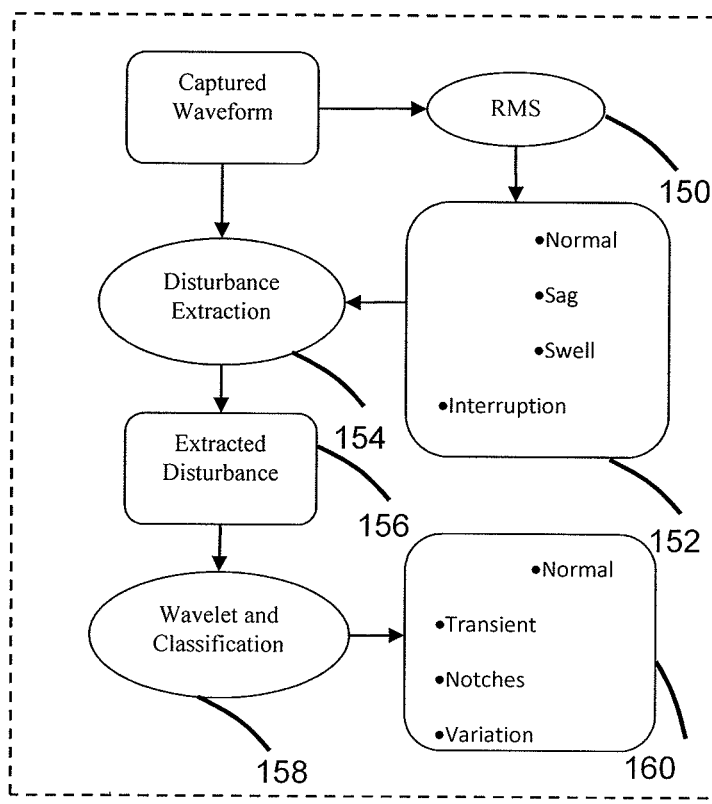
FIG. 11 is the illustration of a flow chart for estimating power quality indicators according to another embodiment of the present invention.

In another embodiment of the present invention as shown in FIG. 11, a method for estimating the PQ indicators uses a different approach than the one in FIG. 10. As one can see, the input of this method in FIG. 11 is no longer the sinusoidal components and wavelet coefficients in FIG. 10 but the original signal and the wavelet coefficients. The method in FIG. 11 is an integrated algorithm for real-time extraction and classification of power disturbance on embedded systems like a smart meter or a power quality monitor. This algorithm is divided into three stages. As shown in FIG. 11, in the initial stage the voltage signal will be evaluated every half-cycle (0.01 s) in Step 150 using RMS value to classify disturbance events 152—interruption, voltage dig and voltage swell according to the standard EN61000-4-30:2009. Furthermore, this result will be used to eliminate the sag/swell cycles in the next stage. In the secondary stage, the disturbance extraction method described will be executed in Step 154 to separate the non-stationary components from the signal. In the final stage, the discrete wavelet transform is applied to extracted disturbance 156 in Step 158 to separate the low-frequency variation and classify disturbance events—transient and notches 160 by counting the transient.

The following section gives examples of application of methods as described above by the way of experiments. The waveform compression method in one embodiment of the present invention was tested with three simulated waveforms as follows:

1) a stationary current harmonic waveform;
2) a current harmonic waveform with an amplitude variation of 70%; and
3) a current harmonic waveform with an oscillating transient. The oscillating transient lasted for 0.02 s with an oscillating frequency of 2500 Hz.

In each case, a sampling frequency of 6400 Hz was used which is commonly used in commercial power quality meters. For each waveform recording, a waveform length of 0.2 s was captured as recommended by EN61000-4-7:2002 for harmonic analysis. Accordingly each waveform was represented by 1280 data samples.

It should be aware that each sampled data of the waveform was represented by a 12-bit integer number. To maximize the available bits for representing the waveform, the method represents the maximum value of the waveform by 2048 (211). The remaining sampled waveform data was then represented by the same scale.

The amplitudes as shown in the reconstructed waveforms (FIGS. 13, 15 and 17) are represented in binary integers.

Figure 12:
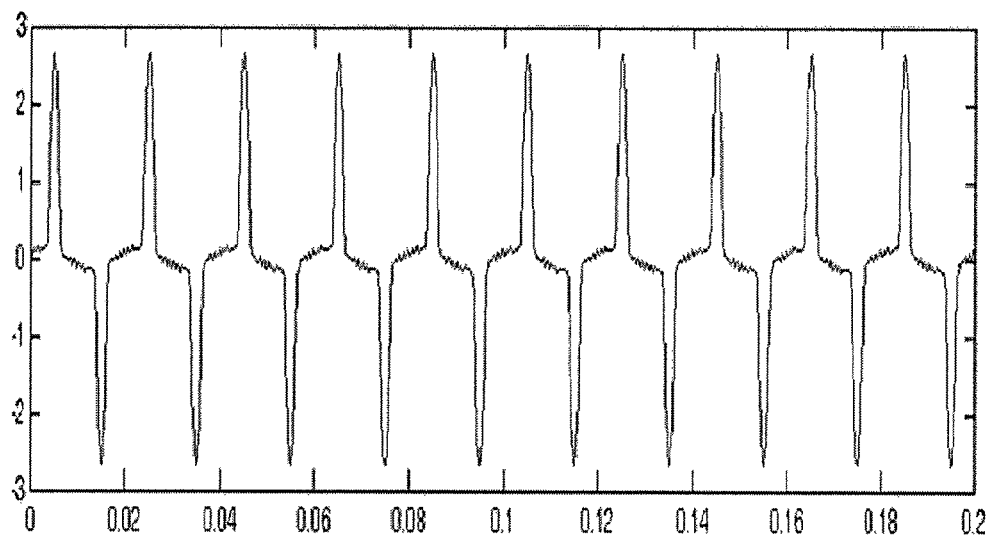
FIG. 12 illustrates a simulated stationary current harmonic waveform.
Figure 13:
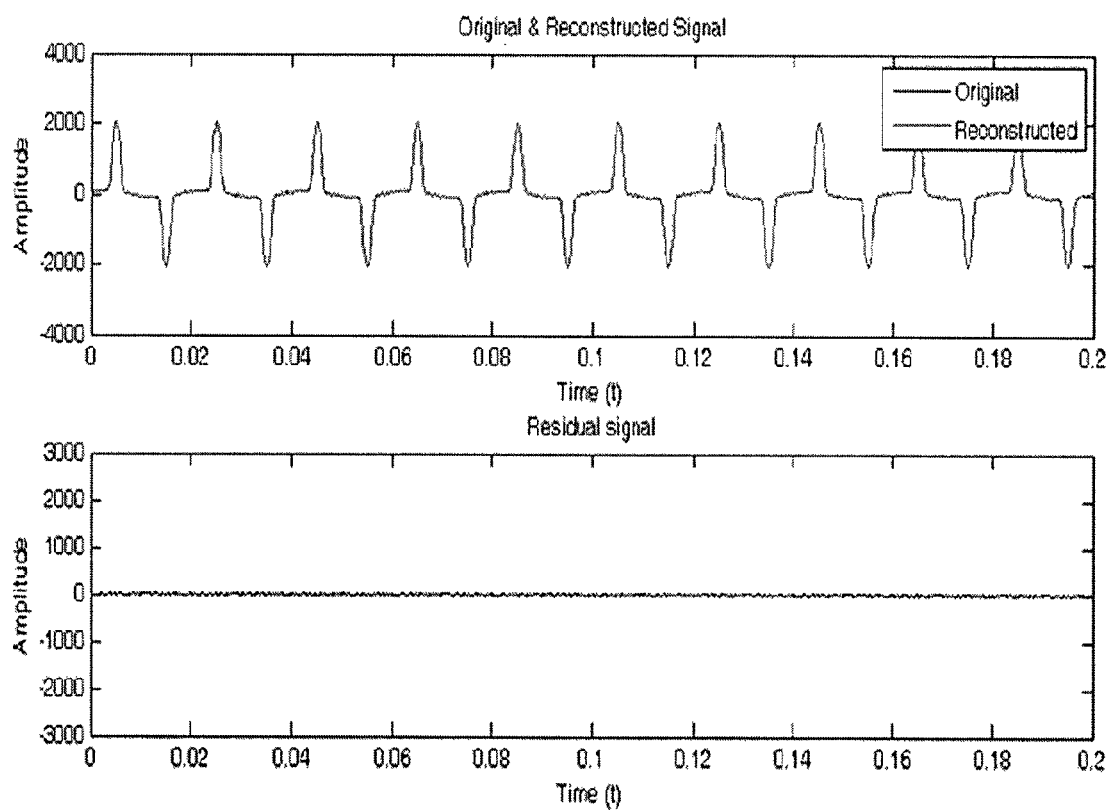
FIG. 13 illustrates a waveform of FIG. 11 after compression and reconstruction by a method according to the invention and the residual of the original and reconstructed waveforms.

FIG. 12 shows the simulated stationary current harmonic waveform. FIG. 13 shows the waveform reconstructed from the waveform compression method. The reconstructed signal is obtained from the output of the waveform compression method. In this case, there is no need to apply DWPT because the harmonic waveform is stationary. It can be seen that the simulated signal and the reconstructed signal are practically identical. The residue signal is therefore of zero amplitude. Including the necessary bits for communication and time stamp, the compression ratio is 1 to 27. In other words, a waveform of 1280 data samples can be represented by approximately 46 data. The data sample length would depend on accuracy required. It is estimated that a data sample length of 12 bits is sufficient.

Figure 14:
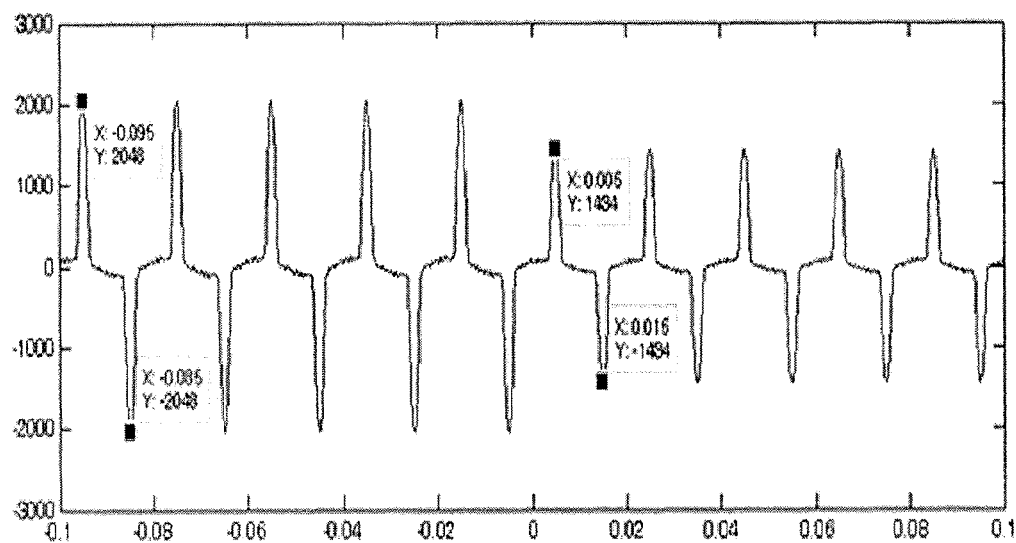
FIG. 14 illustrates a simulated current harmonic waveform with varying amplitude.
Figure 15:
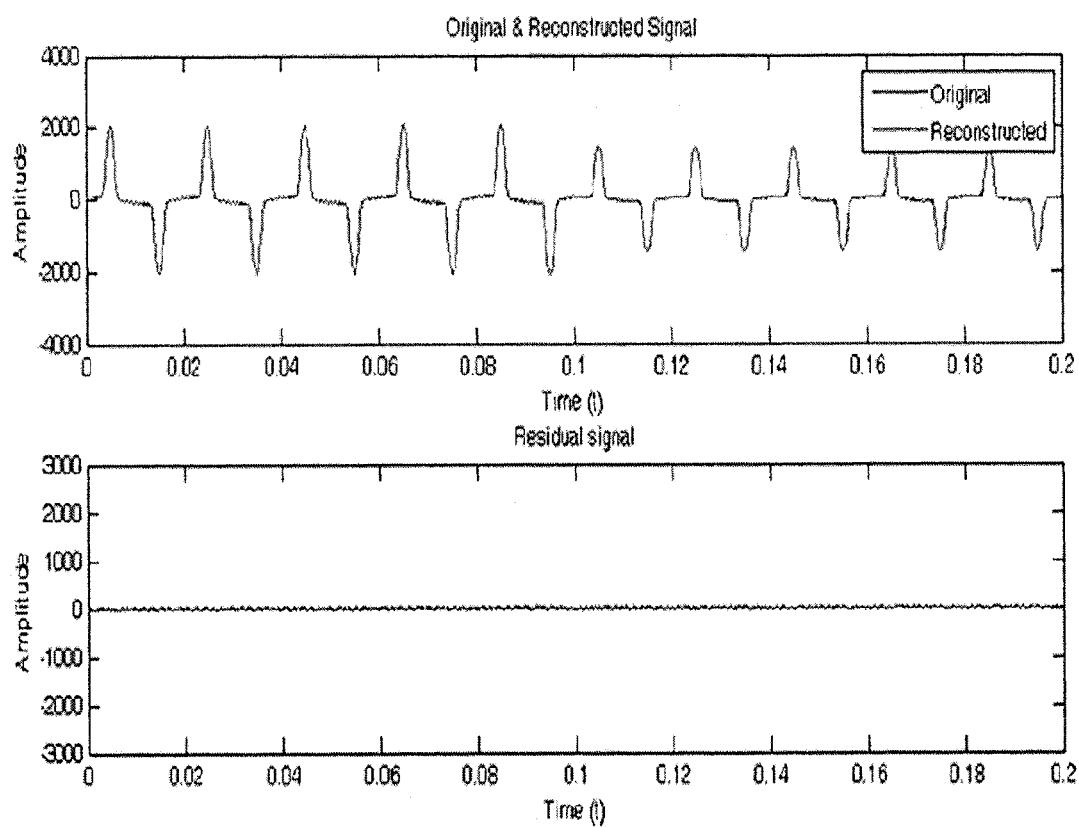
FIG. 15 illustrates a waveform of FIG. 13 after compression and reconstruction by a method according to the invention and the residual of the original and reconstructed waveforms.

FIG. 14 shows the simulated current harmonic waveform with varying amplitude. FIG. 15 shows the waveform reconstructed from the output of the waveform compression method. In this case, both FFT and DWPT were applied due to the variation in harmonics amplitude. It can be seen that the simulated signal and the reconstructed signal are practically identical. The residue signal is therefore of zero amplitude. Including the necessary bits for communication and time stamp, the compression ratio is 1 to 4. In other words, a waveform of 1280 data samples can be represented by approximately 320 data. The compression ratio in this case is dependent on the extent of amplitude variations.

Figure 16:
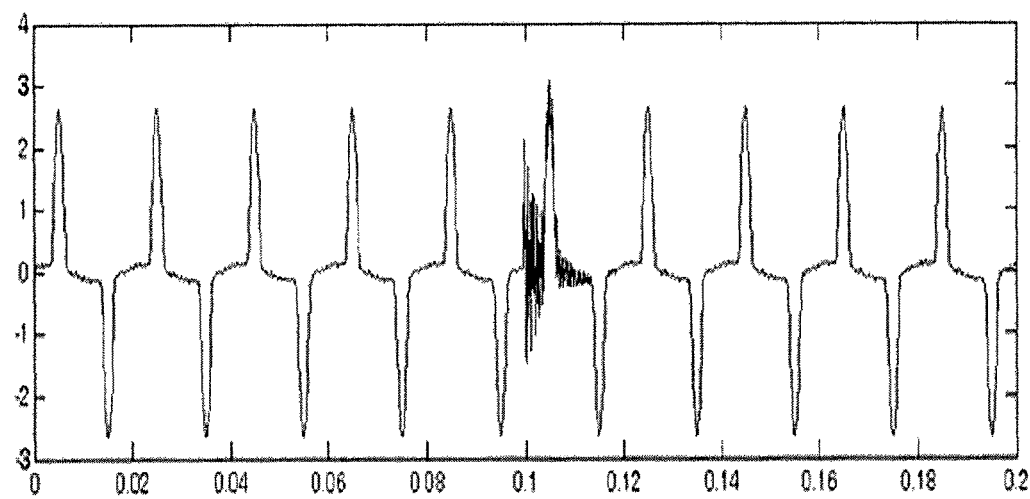
FIG. 16 illustrates a simulated current harmonic waveform with an oscillatory transient.
Figure 17:
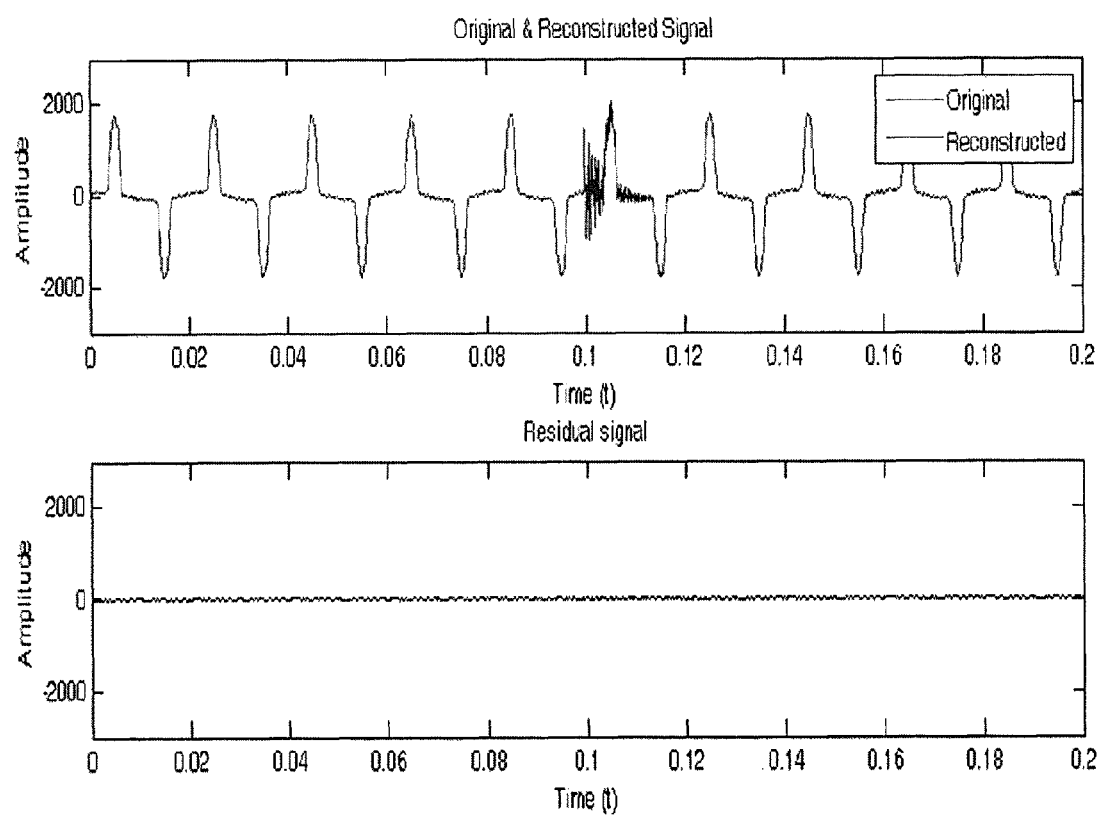
FIG. 17 illustrates a waveform of FIG. 15 after compression and reconstruction by a method according to the invention and the residual of the original and reconstructed waveforms.

FIG. 16 shows the simulated current harmonic waveform with an oscillating transient. FIG. 17 shows the waveform reconstructed from the output of the waveform compression method. As the waveform contains an oscillatory transient, both FFT and DWPT were applied. It can be seen that the simulated signal and the reconstructed signal are practically identical. The residue signal is therefore of zero amplitude. Including the necessary bits for communication and time stamp, the compression ratio is 1 to 4.5. In other words, a waveform of 1280 data samples can be represented by approximately 284 data. The compression ratio in this case would depend on the amplitude of the oscillatory transient.

The exemplary embodiments of the present invention are thus fully described. Although the description referred to particular embodiments, it will be clear to one skilled in the art that the present invention may be practiced with variation of these specific details. Hence this invention should not be construed as limited to the embodiments set forth herein.

For example, the number of current meters and that of voltage meters is given as an example in the embodiment shown in FIG. 1. However, one skilled in the art should realize that there can be other numbers of current meters and/or voltage meters in further configurations to meet different requirements.

The low cost simple power quality (PQ) metering devices in some of the above described embodiments use popular home automation system network such as ZigBee communication protocol for data transmission. A central management system may be used for performing power calculation and power quality analysis. Dependent on the real situation, power line communication (PLC) network would also be employed in other embodiments of the present invention.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

The invention claimed is:

1. A method for performing power quality analysis of an electrical power system using a smart meter associated with the electrical power system, the method comprising:
   capturing an original waveform of the electrical power system representative of one or more power quality disturbances using a current transformer of the smart meter;
   processing the original waveform to determine at least one of a frequency, an amplitude, and a phase information of a stationary component of the original waveform using an application processor of the smart meter;
   reconstructing a waveform based on the at least one of the frequency, the amplitude, and the phase information of the stationary component of the original waveform using the application processor of the smart meter;
   subtracting the reconstructed waveform from the original waveform to generate a residual waveform using the application processor of the smart meter;
   processing the residual waveform with a transform routine to determine one or more wavelet coefficients associated with the residual waveform using the application processor of the smart meter;
   processing the one or more wavelet coefficients to determine one or more power quality disturbances associated with the electrical power system using the application processor of the smart meter;

classifying the one or more power quality disturbances immediately after determining the one or more wavelet coefficients associated with the residual waveform using the application processor of the smart meter; and transmitting, using a communication module of the smart meter, the one or more wavelet coefficients or the at least one of the frequency, the amplitude, and the phase information of the stationary component of the original waveform over a communication network to a remote central management system of a smart metering infrastructure associated with the smart meter for storage, reconstruction or analysis.

2. The method in accordance with claim 1 further comprising compressing the one or more wavelet coefficients associated with the residual waveform using the application processor of the smart meter prior to transmission the remote central management system of the smart metering infrastructure.

3. The method in accordance with claim 1, wherein the communication module is a power line carrier module or a ZigBee module; and the communication network is a corresponding power line communication network or a corresponding ZigBee network.

4. The method in accordance with claim 1, wherein processing the original waveform to determine the at least one of the frequency, the amplitude, and the phase information of the stationary component of the original waveform includes an application of discrete Fourier transform on the original waveform.

5. The method in accordance with claim 1, further comprising filtering the original waveform to remove one or more abnormal cycles in the original waveform using the application processor of the smart meter prior to processing the original waveform to determine the at least one of the frequency, the amplitude, and the phase information of the stationary component of the original waveform.

6. The method in accordance with claim 5, wherein filtering the original waveform to remove one or more abnormal cycles in the original waveform includes eliminating sags or swells from the original waveform.

7. The method in accordance with claim 1, wherein the transform routine arranged to determine one or more wavelet coefficients associated with the residual waveform is a discrete wavelet packet transform routine.

8. The method in accordance with claim 1, wherein processing the one or more wavelet coefficients includes applying a root mean square function to the one or more wavelet coefficients to obtain the one or more power quality disturbances associated with the electrical power system.

9. The method in accordance with claim 8, wherein processing the one or more wavelet coefficients further includes performing statistical analysis on the one or more wavelet coefficients to obtain the one or more power quality disturbances associated with the electrical power system.

10. The method in accordance with claim 9, wherein performing statistical analysis on the one or more wavelet coefficients further includes applying dilation and erosion on the one or more wavelet coefficients.

11. The method in accordance with claim 8, wherein applying the root mean square function to the one or more wavelet coefficients further includes using the at least one of the frequency, the amplitude, and the phase information of the stationary component of the original waveform.

12. The method in accordance with claim 1, further comprising:

reconstructing the waveform at the remote central management system of the smart metering infrastructure using the one or more wavelet coefficients or the at least one of the frequency, the amplitude, and the phase information of the stationary component of the original waveform.

13. A smart meter arranged to perform power quality analysis of an electrical power system, comprising:

a current transformer configured to capture an original waveform of the electrical power system representative of one or more power quality disturbances;

an application processor configured to process the original waveform to determine at least one of a frequency, an amplitude, and a phase information of a stationary component of the original waveform, reconstruct a waveform based on the at least one of the frequency, the amplitude, and the phase information of the stationary component of the original waveform, subtract the reconstructed waveform from the original waveform to generate a residual waveform, process the residual waveform with a transform routine to determine one or more wavelet coefficients associated with the residual waveform, process the one or more wavelet coefficients to determine one or more power quality disturbances associated with the electrical power system, classify the one or more power quality disturbances immediately after determining the one or more wavelet coefficients associated with the residual waveform; and a communication module configured to transmit the one or more wavelet coefficients or the at least one of the frequency, the amplitude, and the phase information of the stationary component of the original waveform over a communication network to a remote central management system of a smart metering infrastructure associated with the smart meter for storage, reconstruction or analysis.

14. The smart meter in accordance with claim 13, wherein the application processor is further configured to compress the one or more wavelet coefficients associated with the residual waveform prior to transmission the remote central management system of the smart metering infrastructure.

15. The smart meter in accordance with claim 13, wherein the communication module is a power line carrier module or a ZigBee module; and the communication network is a corresponding power line communication network or a corresponding ZigBee network.

16. The smart meter in accordance with claim 13, wherein the application processor is further configured to process the original waveform to determine the at least one of the frequency, the amplitude, and the phase information of the stationary component of the original waveform by applying discrete Fourier transform on the original waveform.

17. The smart meter in accordance with claim 13, wherein the application processor is further configured to filter the original waveform to remove one or more abnormal cycle in the original waveform prior to processing the original waveform to determine the at least one of the frequency, the amplitude, and the phase information of the stationary component of the original waveform.

18. The smart meter in accordance with claim 17, wherein the application processor is further configured to filter the original waveform to eliminate sags or swells from the original waveform.

19. The smart meter in accordance with claim 13, wherein the transform routine is further configured to determine one or more wavelet coefficients associated with the residual waveform includes is a discrete wavelet packet transform routine.

20. The smart meter in accordance with claim 13, wherein the application processor is further configured to process the one or more wavelet coefficients by applying a root mean square function to the one or more wavelet coefficients to obtain the one or more power quality disturbances associated with the electrical power system.

21. The smart meter in accordance with claim 13, wherein the application processor is further configured to perform statistical analysis on the one or more wavelet coefficients to obtain the one or more power quality disturbances associated with the electrical power system.

22. The smart meter in accordance with claim 21, wherein the application processor is further configured to perform statistical analysis on the one or more wavelet coefficients by applying dilation and erosion on the one or more wavelet coefficients.

23. The smart meter in accordance with claim 13, wherein the application processor is further configured to apply the root mean square function to the one or more wavelet coefficients using the at least one of the frequency, the amplitude, and the phase information of the stationary component of the original waveform.

* * * * *